(12) United States Patent
Mu

(10) Patent No.: US 8,396,370 B2
(45) Date of Patent: Mar. 12, 2013

(54) PARALLEL OPTICAL TRANSCEIVER MODULE THAT UTILIZES A FOLDED FLEX CIRCUIT THAT REDUCES THE MODULE FOOTPRINT AND IMPROVES HEAT DISSIPATION

(75) Inventor: Jing Hui Mu, San Jose, CA (US)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 1141 days.

(21) Appl. No.: 12/323,743

(22) Filed: Nov. 26, 2008

(65) Prior Publication Data

US 2010/0129083 A1    May 27, 2010

(51) Int. Cl.
*H04B 10/00*    (2006.01)

(52) U.S. Cl. .................................................... 398/135
(58) Field of Classification Search ................... 398/135
See application file for complete search history.

(56) References Cited

U.S. PATENT DOCUMENTS

| | | |
|---|---|---|
| 2005/0220427 A1 | 10/2005 | Therisod |
| 2005/0245103 A1* | 11/2005 | Ellison ............................ 439/61 |
| 2006/0291785 A1 | 12/2006 | Epitaux |

\* cited by examiner

*Primary Examiner* — Kinam Park

(57) ABSTRACT

A parallel optical transceiver module is provided that uses a folded flex circuit arrangement that reduces the footprint of the transceiver module while also providing the module with improved heat dissipation characteristics. In addition, the manner in which components are mounted on the flex circuit facilitates assembly of the module, reducing the overall cost of the module while improving manufacturing yield.

13 Claims, 7 Drawing Sheets

PARALLEL OPTICAL TRANSCEIVER MODULE THAT UTILIZES A FOLDED FLEX CIRCUIT THAT REDUCES THE MODULE FOOTPRINT AND IMPROVES HEAT DISSIPATION

TECHNICAL FIELD OF THE INVENTION

The invention relates to parallel optical transceiver modules. More particularly, the invention relates to a parallel optical transceiver module that uses a folded flex circuit to reduce the spatial footprint of the module while also providing improved heat dissipation characteristics.

BACKGROUND OF THE INVENTION

FIG. 1 illustrates a block diagram of a parallel optical transceiver module 2 currently used in optical communications, which has multiple transmit and multiple receive channels. The transceiver module 2 includes a transmitter portion 3 a receiver portion 4. The transmitter and receiver portions 3 and 4 are controlled by a transceiver controller 6. The transmitter portion 3 comprises components for transmitting data in the form of amplitude modulated optical signals over multiple fibers (not shown). The transmitter portion includes a laser driver 11 and a plurality of laser diodes 12. The laser driver 11 outputs electrical signals to the laser diodes 12 to modulate them. When the laser diodes 12 are modulated, they output optical signals that have power levels corresponding to logic 1s and logic 0s. An optics system (not shown) of the transceiver module 2 focuses the optical signals produced by the laser diodes 12 into the ends of respective transmit optical fibers (not shown) held within a connector (not shown) that mates with the transceiver module.

Typically, a plurality of monitor photodiodes 14 monitor the output power levels of the respective laser diodes 12 and produce respective electrical feedback signals that are fed back to the transceiver controller 6, which processes them to obtain respective average output power levels for the respective laser diodes 12. The controller 6 outputs controls signals to the laser driver 11 that cause it to adjust the bias current signals output to the respective laser diodes 12 such that the average output power levels of the laser diodes are maintained at relatively constant levels.

The receiver portion 4 includes a plurality of receive photodiodes 21 that receive incoming optical signals output from the ends of respective receive optical fibers (not shown) held in the connector. The optics system (not shown) of the transceiver module 2 focuses the light output from the ends of the receive optical fibers onto the respective receive photodiodes 21. The receive photodiodes 21 convert the incoming optical signals into electrical analog signals. The transceiver controller 6 and/or other circuitry (not shown) of the transceiver module 2 processes the electrical signals to recover the data represented by the signals.

The laser driver 11 is typically a separate integrated circuit (IC). The laser diodes 12 are typically also contained in a separate IC. The monitor photodiodes 14 are typically also contained in a separate IC. The transceiver controller 6 is also typically a separate IC. The receiver photodiodes 21 are also typically contained in a separate IC. In addition to these ICs, the transceiver module 2 typically also includes a receiver IC that processes electrical data signals corresponding to the electrical signals produced by the receiver photodiodes 21. These ICs and other components, such as resistors, capacitors and optical elements (e.g., lenses) are typically mounted on some type of circuit board, such as a printed circuit board (PCB) having a generally rigid substrate on which conductive traces are printed or a flexible circuit substrate on which conductive traces are printed or etched. Flexible circuit substrates used for this purpose are typically referred to as flex circuits. Some parallel optical transceiver modules use both a PCB on which some of the aforementioned components are mounted and a flex circuit on which others of the aforementioned components are mounted.

Typically, the PCB or flex circuit includes, or is otherwise in contact with, a heat spreader device, such as a layer of metallic material or a leadframe, for example. The purpose of the heat spreader device is to dissipate heat generated by the electrical components by spreading the heat out away from the components that can be adversely affected by heat. The heat spreader device is typically a generally planar device that spreads heat laterally in directions that are generally coplanar with the plane of the heat spreader device. The heat spreading function is particularly important with respect to the laser diode IC because the performance of a laser diode can easily degrade as its temperature increases. The laser diode driver IC, which is typically placed relatively close to the laser diode IC in order to avoid long lead lengths, generates a large amount of heat. One of the primary functions of the heat spreader device is to move the heat generated by the driver IC away from the laser diode IC so that the heat does not adversely affect the performance of the laser diodes contained in the laser diode IC.

In addition to heat dissipation considerations, there are other considerations that are typically taken into account when designing parallel optical transceiver modules, such as size and inductive coupling, for example. It is generally a design goal for the transceiver module to be small in size, or to have a small "footprint". It is also typically a design goal to have relatively short lead lengths in order to prevent or minimize inductive coupling between adjacent electrical conductors (e.g., wire bonds), which can lead to noise and performance degradation. Placing the laser diode driver IC close to the laser diode IC helps to reduce the footprint of the module and, at the same time, to enable the lengths of the wire bonds that connect the pads of the ICs to be kept relatively short. Keeping these conductor lengths short helps to prevent or minimize inductive coupling between adjacent conductors. However, placing these ICs in close proximity to one another makes it more difficult to isolate the laser diode IC from the heat generated by the laser diode driver IC. Thus, there are tradeoffs that require some balancing between these and other design goals.

A need exists for a parallel optical transceiver module that has a relatively small footprint, is efficient in terms of space consumption, has good heat dissipation characteristics, and that can be manufactured at relatively low cost with relatively high yield.

SUMMARY OF THE INVENTION

The invention is directed to a parallel optical transceiver module that uses a folded flex circuit and methods for preassembling and assembling a parallel optical transceiver module. In accordance with an embodiment, the parallel optical transceiver module has a folded flex circuit having at least upper and lower surfaces and having at least first, second and third flex circuit portions. The flex circuit has a flexible substrate of dielectrically insulating material and a plurality of electrical conductors disposed in or on the substrate. The first and third flex circuit portions extend generally in respective planes that are generally parallel to one another such that the upper surface of the flex circuit in the first flex circuit portion is generally parallel to the upper surface of the flex circuit in the third flex circuit portion. At least one optical/electrical device is mounted on the first flex circuit portion on the upper surface of the flex circuit. The optical/electrical device has one or more electrical contacts that are electrically coupled to one or more of the electrical conductors of the flex circuit. At least one electrical connector is mounted on the third flex circuit portion on the upper surface of the flex circuit. The electrical connector has one or more electrical contacts that are electrically coupled to one or more of the electrical conductors of the flex circuit such that one or more of the electrical contacts of the electrical connector are electrically coupled to one or more electrical contacts of the optical/electrical device.

In accordance with another embodiment, the parallel optical transceiver module has a folded flex circuit having at least upper and lower surfaces and having at least first, second, third, fourth, and fifth flex circuit portions. The folded flex circuit has a flexible substrate of dielectrically insulating material and a plurality of electrical conductors disposed in or on the substrate. The first and fifth flex circuit portions extend generally in respective planes that are generally co-planar to one another and generally parallel to a plane in which the third flex circuit portion extends such that the upper surface of the flex circuit in the first and fifth flex circuit portions are generally co-planar to one another and generally parallel to the upper surface of the flex circuit in the third flex circuit portion. At least a first optical/electrical device is mounted on the first flex circuit portion on the upper surface of the flex circuit. The first optical/electrical device has one or more electrical contacts that are electrically coupled to one or more of the electrical conductors of the flex circuit. At least a second optical/electrical device is mounted on the fifth flex circuit portion on the upper surface of the flex circuit. The second optical/electrical device has one or more electrical contacts that are electrically coupled to one or more of the electrical conductors of the flex circuit. At least one electrical connector is mounted on the third flex circuit portion on the upper surface of the flex circuit. The electrical connector has one or more electrical contacts that are electrically coupled to one or more of the electrical conductors of the flex circuit such that electrical contacts of the electrical connector are electrically coupled to electrical contacts of the first and second optical/electrical devices.

In accordance with one embodiment, a method for pre-assembling a parallel optical transceiver module is provided. The method comprises providing a generally planar flex circuit having at least upper and lower surfaces and having at least first, second and third flex circuit portions, mounting at least one optical/electrical device on the first flex circuit portion on the upper surface of the flex circuit, mounting at least one electrical connector on the third flex circuit portion on the upper surface of the flex circuit, and folding the flex circuit such that the upper surface of the flex circuit in the first flex circuit portion is generally parallel to the upper surface of the flex circuit in the third flex circuit portion.

In accordance with another embodiment, a method is provided for assembling a parallel optical transceiver module that includes a folded flex circuit. The method includes providing a folded flex circuit having at least upper and lower surfaces and having at least first, second and third flex circuit portions. The flex circuit has a flexible substrate of dielectrically insulating material and a plurality of electrical conductors disposed in or on the substrate. The first and third flex circuit portions extend generally in respective planes that are generally parallel to one another such that the upper surface of the flex circuit in the first flex circuit portion is generally parallel to the upper surface of the flex circuit in the third flex circuit portion. The method includes mounting at least one optical/electrical device on the first flex circuit portion on the upper surface of the flex circuit and mounting at least one electrical connector on the third flex circuit portion on the upper surface of the flex circuit.

These and other features and advantages of the invention will become apparent from the following description, drawings and claims.

DETAILED DESCRIPTION OF AN ILLUSTRATIVE EMBODIMENT

In accordance with the invention, a parallel optical transceiver module is provided that uses a folded flex circuit arrangement that reduces the footprint of the transceiver module while also providing the module with improved heat dissipation characteristics. In addition, the manner in which components are mounted on the flex circuit facilitates manufacturing of the module, thereby reducing the overall cost of the module while improving manufacturing yield.

Figure 2:
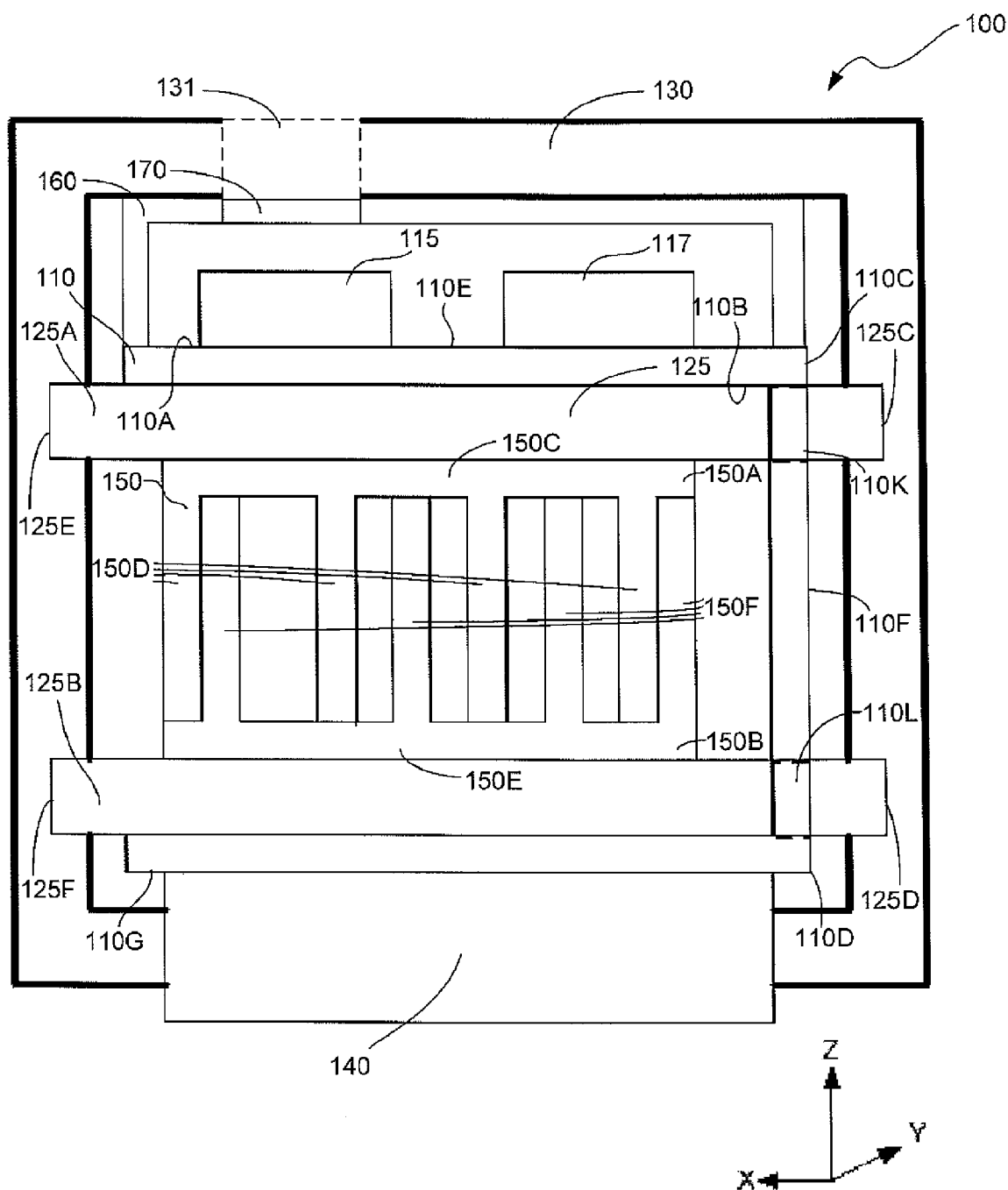
FIG. 2 illustrates a side plan view of the parallel optical transceiver module in accordance with an illustrative embodiment of the invention.

FIG. 2 illustrates a side view of the parallel optical transceiver module 100 of the invention in accordance with an illustrative embodiment. The module 100 includes a flex circuit 110 having an upper surface 110A and a lower surface 110B. The flex circuit 110 has a first fold 110C and a second fold 110D formed therein. The folds 110C and 110D subdivide the flex circuit 110 into a first portion 110E, a second portion 110F and a third portion 110G. Each of the first, second and third portions 110E, 110F and 110G is generally planar in geometry and extends in a respective plane. For example, assuming the module 100 is oriented in a reference frame that is defined by an X, Y, Z Cartesian coordinate system, the first and third portions 110E and 110G extend in respective X-Y planes that pass through the Z-axis at different respective Z coordinates. The second portion 110F extends in a Y-Z plane that passes through the X-axis at a particular X coordinate. Thus, the respective X-Y planes in which the first and third portions 110E and 110G extend are parallel to each other and are orthogonal to the Y-Z plane in which the second portion 110F extends. It should be noted, however, that the flex circuit 110 may have other orientations and that the portions 110E-110G need not be parallel or orthogonal to each other.

The transceiver module 100 includes one or more optical-to-electrical or electrical-to-optical devices, such as a laser diode IC (not shown) and/or a receive photodiode IC (not shown), for example, which are mounted on the upper surface 110A of the first portion 110E of the flex circuit 110. These components are represented by block 115 in FIG. 2. Typically, both a laser diode IC and a receive photodiode IC are mounted on the upper surface 110A of the first portion 110E. Electrical devices preferably are also mounted on the upper surface 110A of the first portion 110E of the flex circuit 110. The term "optical/electrical device" will be used herein to refer to electrical-to-optical devices and to optical-to-electrical devices. Block 117 in FIG. 2 represents one or more other devices mounted on the upper surface 110A of the flex circuit 110 on the first portion 110E. The other devices represented by block 117 may include, for example, a laser diode driver IC and/or a receiver IC and/or a transceiver controller IC.

An electrical connector 140 is mounted on the upper surface 110A of the third portion 110G of the flex circuit 110. The electrical connector 140 may be, for example, a ball grid array (BGA), a pin grid array (PGA), or a land grid array (LGA). The electrical connector 140 provides an electrical interface for electrically interconnecting the module 100 with other electrical circuits, such as a PCB or another IC, for example. The flex circuit 110 is typically made of a dielectrically insulating material, such as, for example, polyimide (PI), polyester (PET), or polyethylene napthalate (PEN), and has a pattern of electrical conductors (not shown) disposed in or on it. At least some of the electrical conductors of the flex circuit 110 have first ends that are electrically coupled to electrical contacts (not shown) of the devices 115 and 117 and second ends that are electrically coupled to electrical contacts (not shown) of the electrical connector 140.

A stiffener device 125, which is typically made up of a substantially rigid material, such as aluminum, for example, is provided in the module 100. The stiffener 125 typically comprises first and second stiffener portions 125A and 125B, respectively, which are separate from one another, although a single-part stiffener may instead be used for this purpose. First ends 125C and 125D of the stiffener portions 125A and 125B, respectively, pass through slots 110K and 110L, respectively, formed in the flex circuit 110 and come into contact with an inner wall of the module housing 130. Second ends 125E and 125F of the stiffener portions 125A and 125B, respectively, also come into contact with inner walls of the module housing 130. The stiffener 125 provides mechanical stability to the flex circuit 110 to help maintain the first, second and third portions 110E, 110F and 110G of the flex circuit 110 in their respective, generally planar positions.

The material that the stiffener 125 is made of preferably is thermally conductive. Heat generated by the components represented by blocks 115 and 117 is transferred from the flex circuit 110 into the stiffener portion 125A and then is spread out laterally throughout the stiffener portion 125A. The module housing 130 preferably is also made of a thermally conductive material, such as aluminum or copper, for example. Making the module housing 130 of a thermally conductive material ensures that at least some of the heat that is transferred into the stiffener 125 is subsequently transferred into the housing 130 via the mechanical coupling between the ends 125C, 125D, 125E, and 125F of the stiffener device 125 and the inner wall of the housing 130.

Preferably, the module 100 includes an optics system holder 160 that is seated and secured to the upper surface 110A of the third portion 110E of the flex circuit 110. The optics system holder 160 holds an optics system 170, which is positioned below and in substantial alignment with an opening 131 formed in the housing 130. The optics system 170 is designed to couple light between laser diodes (not shown) of the transmitter side of the module 100 and transmit optical fibers (not shown) and to couple light between photodiodes of the receiver side and receive optical fibers (not shown). The optics system 170 may include one or more lenses for focusing light generated by laser diodes into the ends of transmit fibers, one or more lenses for focusing light propagating out of the ends of receive fibers onto respective photodiodes, one or more optically diffractive elements for diffracting light, one or more optically reflective elements, one or more optically refractive elements, and/or one or more imaging elements. The invention is not limited to any particular design or configuration for the optical system 170. Also, separate respective optics systems 170 may be provided for the transmit side and for the receive side of the transceiver module 100.

It can be seen from FIG. 2 that the footprint of the module 100, i.e., the area of the module 100 in the X and Y dimensions, is only about as large as the area of the electrical connector 140 in the X and Y dimensions. This small module footprint is made possible through the folded configuration of the flex circuit 110 and by mounting the components represented by blocks 115, 117 on the first portion 110E opposite the portion 110G on which the electrical connector 140 is mounted. The small footprint of the module 100 is advantageous for several reasons, one being that it enables the module 100 to be used in a customer system that has high component density.

In such environments, it is very important for the module 100 to have very good heat dissipation characteristics. The module 100 includes a heat spreader device 150 for dissipating heat generated by components of the module 100. The heat spreader device 150 is not limited to having any particular configuration or shape. The configuration of the heat spreader device shown in FIG. 2 is one of many possible configurations for the heat spreader device 150. The heat spreader device 150 is made of a thermally conductive material, such as copper or aluminum, for example. The heat spreader device 150 comprises a first heat spreader portion 150A and a second heat spreader portion 150B. The first heat spreader portion 150A includes a base 150C and a plurality of legs 150D having proximal ends that are attached to or integrally formed with the base 150C and having distal ends that are disposed a particular distance away from the base 150C. The base 150C is in contact with the stiffener portion 125A so that most of the heat that is transferred into the stiffener portion 125A is then transferred into base 150C of the first heat spreader portion 150A. The second heat spreader portion 150B preferably is identical in shape to the first heat spreader portion 150A. The second heat spreader portion 150B includes a base 150E and a plurality of legs 150F having proximal ends that are attached to or integrally formed with the base 150E and having distal ends that are disposed a particular distance away from the base 150E. The base 150E is in contact with the stiffener portion 125B so that most of the heat that is transferred into the stiffener portion 125B is then transferred into the base 150E of the second heat spreader portion 150B.

Figure 3:
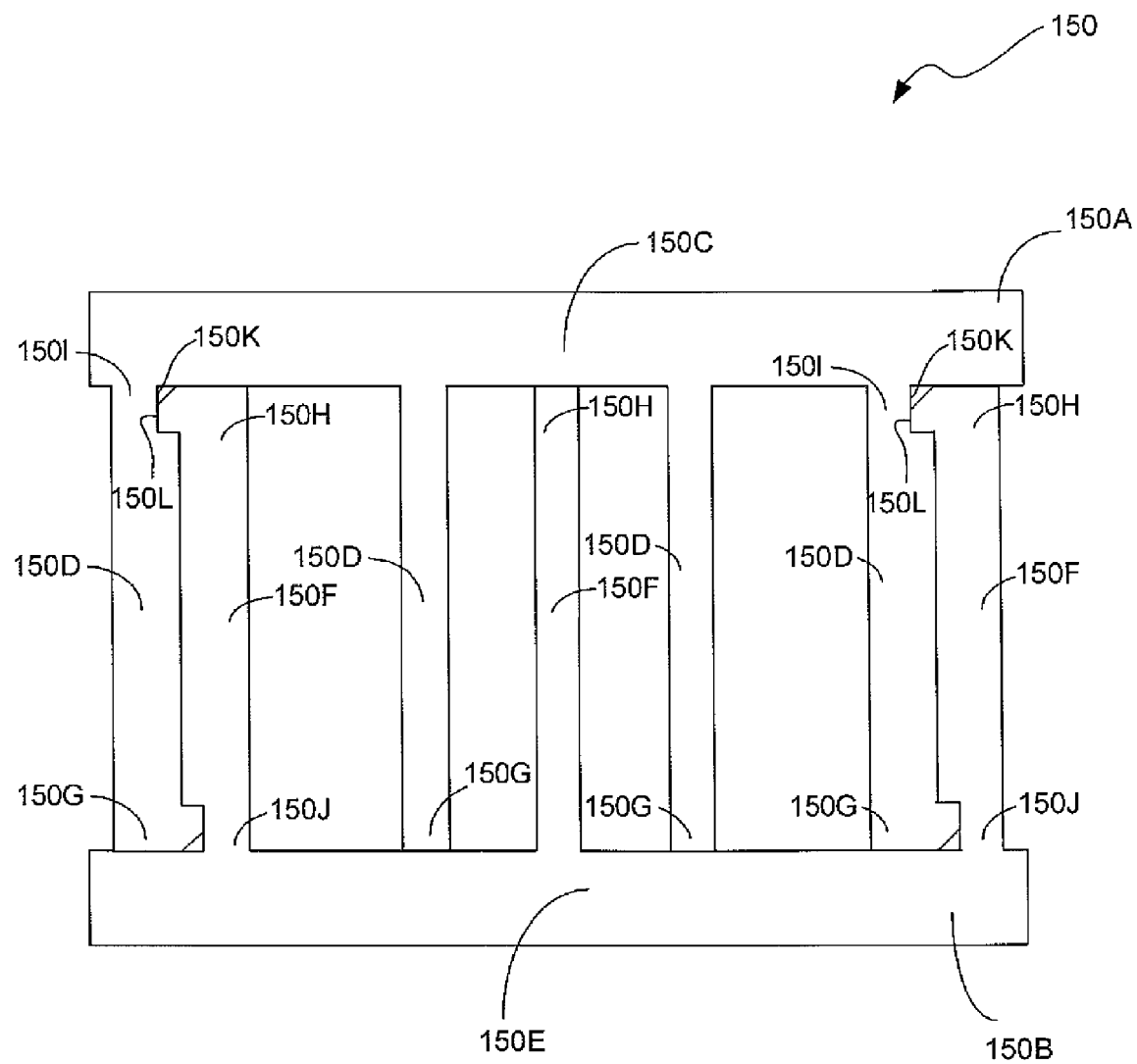
FIG. 3 illustrates a side view of the heat spreader device shown in FIG. 2 in accordance with an illustrative or exemplary embodiment.

FIG. 3 illustrates a side view of the heat spreader device 150 shown in FIG. 2 in accordance with an illustrative or exemplary embodiment. The distal ends 150G of the first heat spreader portion 150A come into contact with the base 150E of the second heat spreader portion 150B. Likewise, the distal ends 150H of the second heat spreader portion 150B come into contact with the base 150C of the first heat spreader portion 150A. The proximal ends 150I and 150J of the outermost ones of the legs 150D and 150F, respectively, of the first and second heat spreader portions 150A and 150B, respectively, have small locking indentations 150K formed in them. The distal ends 150G and 150H of the outermost ones of the legs 150D and 150F, respectively, of the first and second heat spreader portions 150A and 150B, respectively, have small locking protrusions 150L formed in them. These locking indentations and protrusions 150K and 150L, respectively, form a self-locking mechanism that locks the heat spreader portions 150A and 150B together in the position depicted in FIGS. 2 and 3 when the flex circuit 110 is folded. Specifically, respective ones of the indentations 150K interlock with respective ones of the protrusions 150L when the flex circuit 110 (FIG. 2) is folded inwards by approximately 180°. In this manner, the folded configuration of the flex circuit 110 is fixed and stabilized.

In between the legs 150D and 150F of the first and second heat spreader portions 150A and 150B, respectively, air gaps exist that allow air to flow between the heat spreader portions 150A and 150B. As heat spreads into the legs 150D and 150F of the heat spreader portions 150A and 150B, respectively, at least some of the heat is dissipated by the air flowing between the legs 150D and 150F. This heat dissipation system is very effective and allows the first and third portions 110E (FIG. 2) and 110G (FIG. 2), respectively, of the flex circuit 110 (FIG. 2) to be in relatively close proximity to one another, which enables the module 100 (FIG. 2) to be very small in the Z dimension. Thus, the module 100 (FIG. 2) has a very small footprint in the X and Y dimensions and is very compact in height (i.e., the Z dimension). These features of the invention are highly desirable and are particularly advantageous for a parallel optical transceiver module that has multiple transmit and/or multiple receive channels and associated circuitry, which tend to generate a large amount of heat.

Preferably, the module 100 (FIG. 2) is secured within a housing 130 (FIG. 2), although the module 100 can be used without the housing. When the module 100 is housed in the housing 130, the components represented by boxes 115 and 117 (FIG. 2) are completely contained within the housing 130 (FIG. 2). Containment of these components within the housing 130 (FIG. 2) reduces or eliminates problems with electrostatic discharge (ESD) and electromagnetic interference (EMI), which are problems often encountered in known optical transceiver modules. In addition, the housing 130 (FIG. 2) helps to prevent or reduce the existence of dust and other particles inside of the housing 130. The existence of dust and other particles can degrade the performance of laser diodes and photodiodes. Thus, the housing 130 (FIG. 2) helps to ensure that the performance of these components 115, 117 and of the transceiver module 100 will not be detrimentally affected by dust and other particles.

Figure 4:
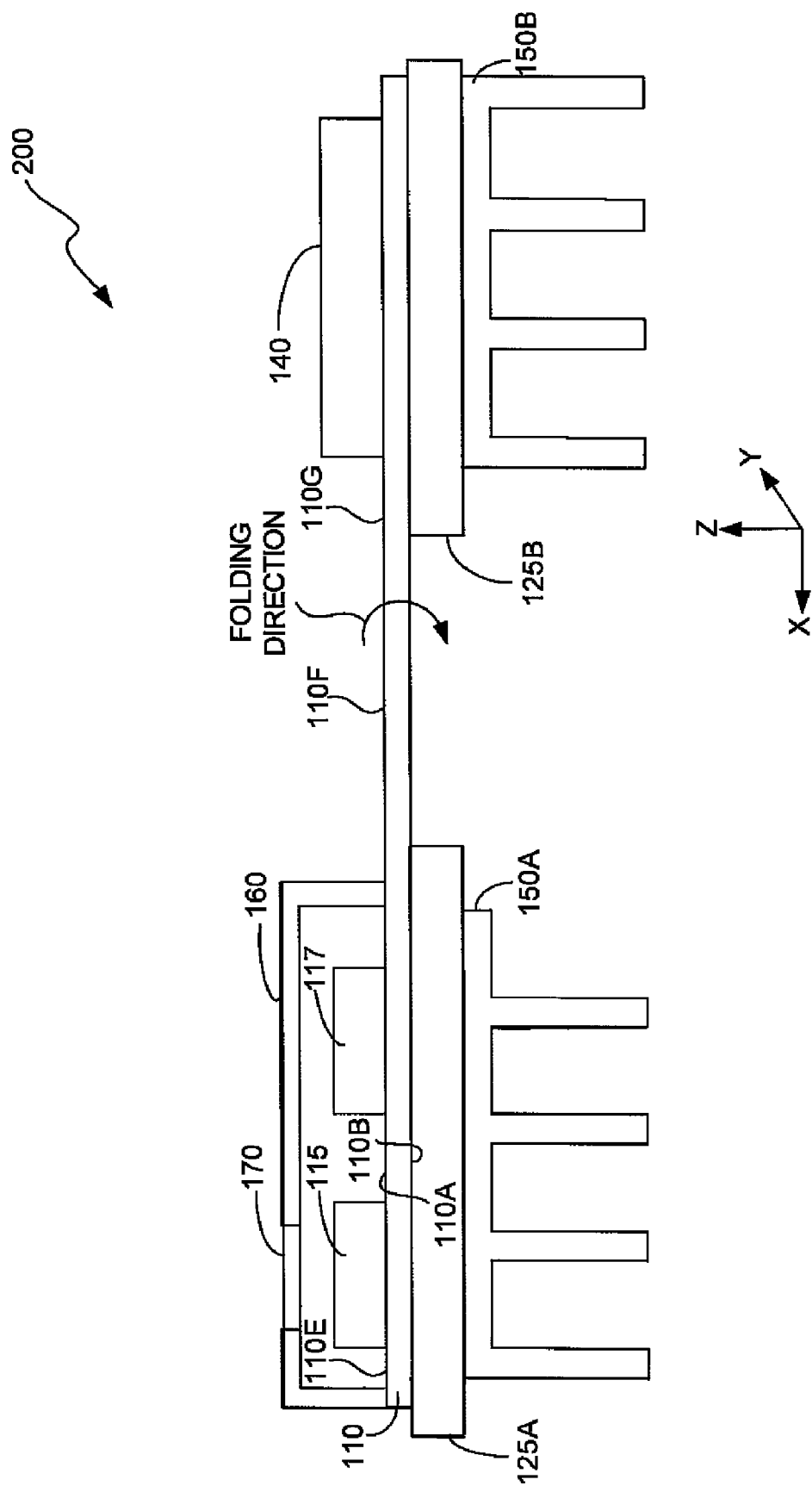
FIG. 4 illustrates a side view of the module shown in FIG. 2 when the module is in its pre-assembled form.

FIG. 4 illustrates a side view of the module 100 shown in FIG. 2 when the module 100 is in its pre-assembled form. The pre-assembled module 200 is essentially identical to the assembled module 100 shown in FIG. 2 except that the pre-assembled module 200 does not include the housing 130 shown in FIG. 2 and the flex circuit 110 is in its unfolded state. In accordance with the embodiment shown in FIG. 4, prior to the folding of the flex circuit 110 and assembling the module 100, the flex circuit 110 is a generally planar substrate extending only in the X-Y plane. For purposes of discussion and demonstration, it is assumed that the flex circuit 110 has only a length (i.e., an extent in the X dimension) and width (i.e., an extent in the Y dimension). However, it will be understood by those of ordinary skill in the art that the flex circuit 110, in its unfolded state, has some finite thickness (i.e., an extent in the Z dimension) when it is in its unfolded state, although the thickness is typically extremely small.

During a pre-assembly process, the pre-assembled module 200 is created as follows. The components represented by blocks 115, 117 are mounted on the upper surface 110A of the first portion 110E of the flex circuit 110. The optics system holder 160 is secured the upper surface 110A of the first portion 110E. The optics system 170 may be secured to the holder 160 at this time or at some later time. On the upper surface 110A of the third portion 110G of the flex circuit 110, the electrical connector 140 is mounted. On the lower surface 110B of the first portion 110E of the flex circuit 110, the first stiffener portion 125A is mounted. The first heat spreader portion 150A is secured to the first stiffener portion 125A. On the lower surface 110B of the third portion 110G of the flex circuit 110, the second stiffener portion 125B is mounted. The second heat spreader portion 150B is secured to the second stiffener portion 125B.

After the pre-assembly process has been performed to obtain the pre-assembled module 200 shown in FIG. 4, an assembly process is performed during which the flex circuit 110 is folded inwards by about 180° until the locking mechanism comprising the indentations and protrusions 150K and 150L (FIG. 3), respectively, formed on the outermost ones of the legs 150D and 150F (FIG. 3), respectively, is locked, as described above with reference to FIG. 3. For ease of illustration, the indentations 150K and protrusions 150L are not shown in FIG. 4. After the flex circuit 110 has been folded, the flex circuit 110 has the shape shown in and described above with reference to FIG. 2. Subsequently, the folded flex circuit 110 having the components 115, 117, 125, 140, 150, 160, and 170 secured thereto is secured within the housing 130 (FIG. 2) to achieve the configuration of the module 100 shown in FIG. 2. The ease with which the module 100 shown in FIG. 2 is assembled in this manner facilitates the overall manufacturing process and helps to improve manufacturing yield.

The pre-assembly and assembly processes may be combined into a single assembly process or they may be performed as completely separate processes. For example, one manufacturer may manufacture the pre-assembled module 200 shown in FIG. 4 and then a different manufacturer or the customer may obtain the pre-assembled modules 200 and perform the assembly process described above to create the assembled module 100 shown in FIG. 2. Also, many other well known steps are typically performed during the pre-assembly and/or the assembly process, such as, for example, die attachment processes, wire bonding processes, optical and mechanical alignment steps, etc In the interest of brevity, these well known steps that are typically used during optical transceiver module manufacturing processes will not be described herein.

Figure 5:
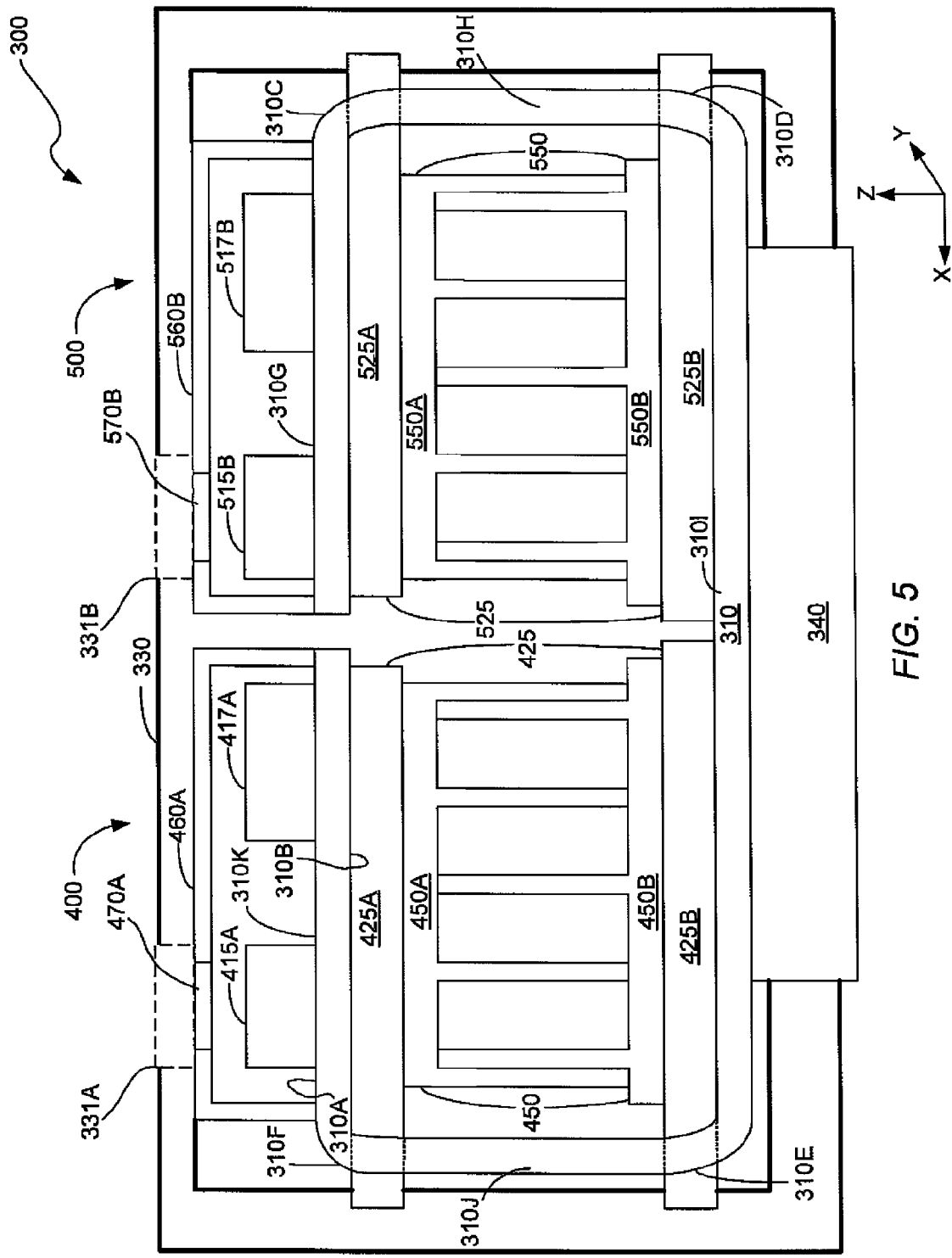
FIG. 5 illustrates a side view of an optical communications module in accordance with another illustrative embodiment in which two optical transceiver modules utilize a single flex circuit and a single electrical connector.

FIG. 5 illustrates a side view of an optical communications module 300 in accordance with another illustrative embodiment in which two optical transceiver modules 400 and 500 utilize a single flex circuit 310 and a single electrical connector 340. The flex circuit 310 shown in FIG. 5 may be identical to the flex circuit 110 described above with reference to FIG. 2, except that the flex circuit 310 typically has a length (i.e., extent in the X dimension) that is greater than the length of the flex circuit 110 to enable additional components to be mounted on the flex circuit 310. Like the flex circuit 110 (FIG. 2), the flex circuit 310 shown in FIG. 5 has an upper surface 310A and a lower surface 310B. In accordance with this embodiment, the flex circuit 310 has a first fold 310C, a second fold 310D, a third fold 310E, and a fourth fold 310F formed in it. The folds 310C, 310D, 310E, and 310F subdivide the flex circuit 310 into a first portion 310G, a second portion 310H, a third portion 310I, a fourth portion 310J, and a fifth portion 310K. Each of the first, second, third, fourth and fifth portions 310G, 310H, 310I, 310J, and 310K, respectively, is generally planar in geometry and extends in a respective plane. For example, assuming the module 300 is oriented in a reference frame that is defined by an X, Y, Z Cartesian coordinate system, the first, third and fifth portions 310G, 310I and 310K extend in respective X-Y planes that pass through the Z-axis at different respective Z coordinates. The second and fourth portions 310H and 310J, respectively, extend in a Y-Z plane that passes through the X-axis at a particular X coordinates. Thus, the respective X-Y planes in which the first, third and fifth portions 310G, 310I and 310K, respectively, extend are parallel to each other and are orthogonal to the Y-Z plane in which the second portion and fourth portions 310H and 310J, respectively, extend.

The transceiver modules 400 and 500 each include one or more optical/electrical devices, such as a laser diode IC (not shown) and/or a receive photodiode IC (not shown), for example, which are mounted on the upper surface 310A of the flex circuit 310 on the first portion 310G and the fifth portion 310K of the flex circuit 310. Typically, both a laser diode IC and a receive photodiode IC are mounted on the upper surface 310A of the flex circuit 310 on the first and fifth portions 310G and 310K, respectively. The blocks 415 and 515 each represent one or more optical/electrical devices. Blocks 417 and 517 each represent one or more other electrical devices that are mounted on the upper surface 310A of the flex circuit 310 on the first and fifth portions 310G and 310K, respectively. The other devices represented by blocks 417 and 517 may include, for example, a laser diode driver IC and/or a receiver IC and/or a transceiver controller IC.

An electrical connector 340 is mounted on the upper surface 310A of the flex circuit 310 on the third portion 310I. The electrical connector 340 may be, for example, a BGA, a PGA, or a LGA. The electrical connector 340 provides an electrical interface for electrically interconnecting the optical communications module 500 with other electrical circuits, such as a PCB or another IC, for example. The flex circuit 310 is typically made of a dielectrically insulating material, such as, for example, PI, PET, or PEN, and has a pattern of electrical conductors (not shown) disposed in or on it. At least some of the electrical conductors of the flex circuit 310 have first ends that are electrically coupled to electrical contacts (not shown) of the devices represented by blocks 415, 417, 515, and 517 and second ends that are electrically coupled to electrical contacts (not shown) of the electrical connector 340.

The transceiver modules 400 and 500 include stiffener devices 425 and 525, respectively. Each of the stiffener devices 425 and 525 is typically made up of a substantially rigid material, such as aluminum, for example. The stiffeners 425 and 525 each typically comprise first and second stiffener portions 425A, 425B and 525A, 525B, respectively, which are separate from one another, although a single-part stiffener device may instead be used for this purpose. The stiffener devices 425 and 525 may be identical to the stiffener device 125 described above with reference to FIG. 2. Therefore, in the interest of brevity, a detailed description of the stiffener devices 425 and 525 will not be provided herein.

The optical communications module 300 includes a housing 330, which is essentially identical to the housing 130 described above with reference to FIG. 2. Preferably, the transceiver modules 400 and 500 include optics system holders 460 and 560, respectively, that are seated and secured to the upper surface 310A of the first and fifth portions 310G and 310K, respectively, of the flex circuit 310. The optics system holders 460 and 560 hold optics systems 470 and 570, respectively, which are positioned below and in substantial alignment with openings 331A and 331B, respectively, formed in the housing 330. The holders 460, 560 and the optics system 470, 570 preferably are identical to the holder 160 and the optics system 170, respectively, described above with reference to FIG. 2.

It can be seen from FIG. 5 that the footprint of the optical communications module 300, i.e., the area of the module 300 in the X and Y dimensions, is only about as large as the area of the electrical connector 340 in the X and Y dimensions. This small module footprint is made possible through the folded configuration of the flex circuit 310 and by mounting the components represented by blocks 415, 417, 515, and 517 on the first and fifth flex circuit portions 310G and 310K opposite the flex circuit portion 310I on which the electrical connector 340 is mounted. The small footprint of the module 300 is advantageous for the same reasons as those described above with reference to the module 100 shown in FIG. 2.

The modules 400 and 500 include heat spreader devices 450 and 550, respectively, for dissipating heat generated by components of the module 400 and 500, respectively. The heat spreader devices 450 and 550 include first and second heat spreader portions 450A, 450B and 550A, 550B, respectively. The heat spreader devices 450 and 550 preferably are identical to the heat spreader device 150 described above with reference to FIGS. 2 and 3. Therefore, in the interest of brevity, a detailed description of the heat spreader devices 450 and 550 will not be provided herein.

The communications module 300 has many of the same advantages as those described above with reference to the module 100 shown in FIG. 2. As indicated above, the module 300 has a relatively small footprint. The module 300 is also compact in height (small in the Z dimension). The module 300 also has very good heat dissipation characteristics. The module 300 is also efficient in terms of parts in that the transceiver modules 400 and 500 utilize the same flex circuit 310 and the same electrical connector 340. The module 300 may be pre-assembled and assembled in a similar manner to that in which the module 100 (FIG. 2) is pre-assembled and assembled, except that the flex circuit 310 of the module 300 has additional folds formed in it and an at least one additional optical/electrical device 415 and electrical device 417 mounted thereon. Therefore, a detailed description of the pre-assembly and assembly processes that are used to make the module 300 will not be provided herein.

Figure 1:
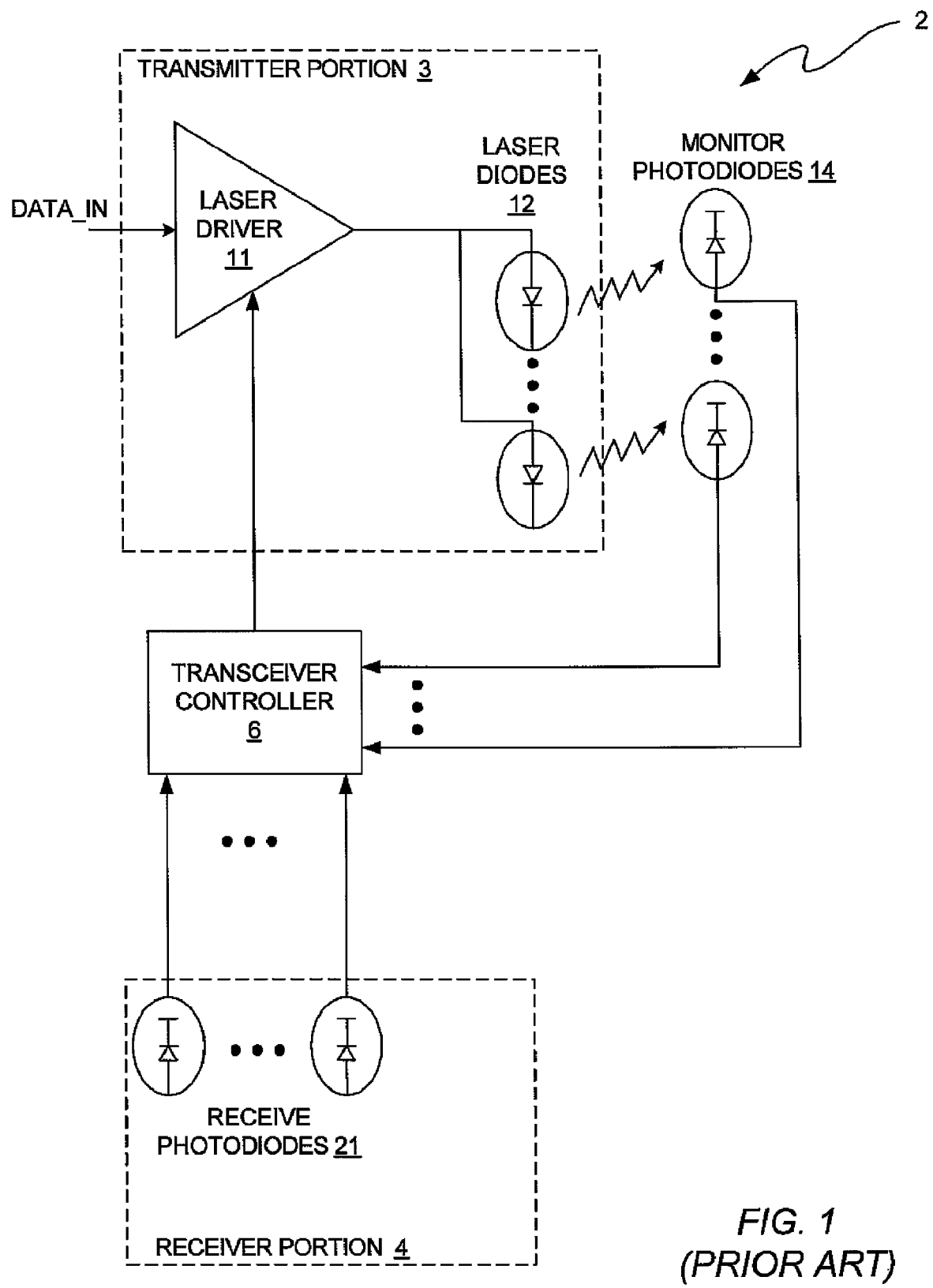
FIG. 1 illustrates a block diagram of a known parallel optical transceiver module currently used in optical communications.

It should be noted that the term "optical transceiver module" as that term is used herein, is intended to denote a module that only has parts for functioning as a transmitter, or that only has parts for functioning as a receiver, or has parts for functioning as both a transmitter and as a receiver. Thus, the transceiver module 100 shown in FIG. 1 may include only transmit channel parts, only receive channel parts, or both transmit and receive channel parts. Likewise, each of the transceiver modules 400 and 500 shown in FIG. 5 may include only transmit channel parts, only receive channel parts, or both transmit and receive channel parts. For example, module 400 may include only transmit channel parts while module 500 includes only receive channel parts, and vice versa. Alternatively, modules 400 and 500 may each include both transmit and receive channel parts. Similarly, the term "optical transceiver module", as that term is used herein, denotes a module that includes a single optical transceiver module of the type shown in FIG. 2 as well as a module that includes multiple optical transceiver modules, such as that shown in FIG. 5.

Figure 6:
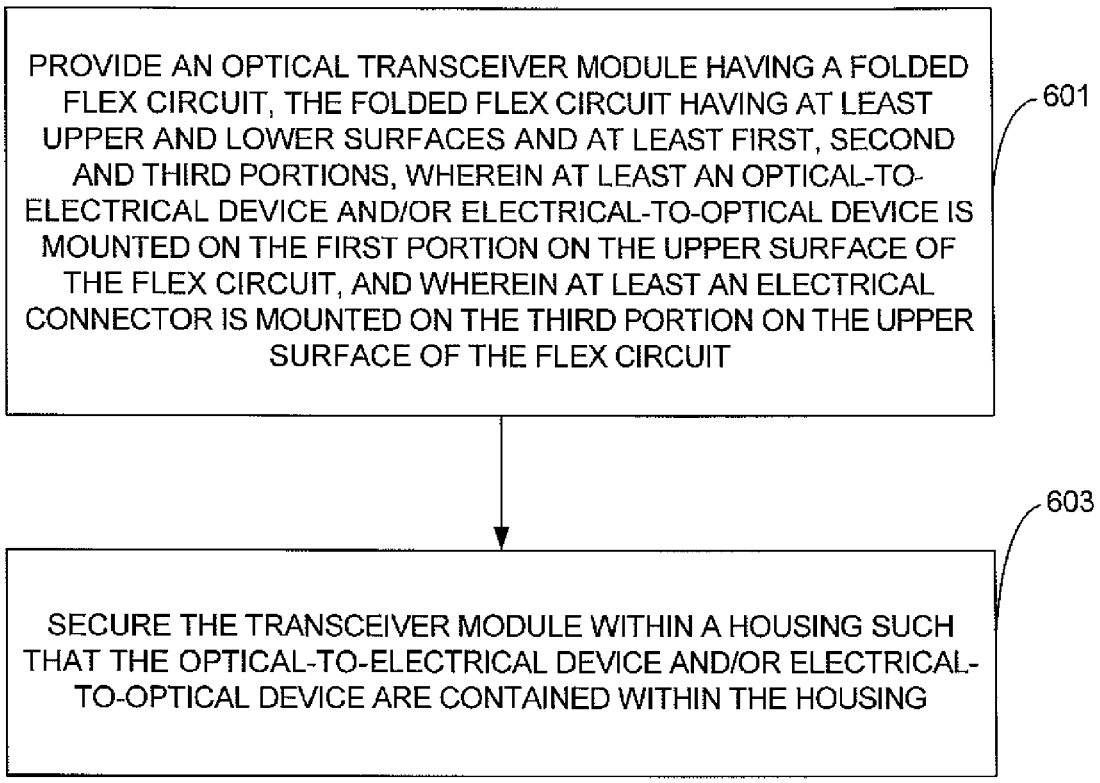
FIG. 6 illustrates a flowchart that represents the method of the invention in accordance with an illustrative embodiment for providing an optical transceiver module that utilizes a folded flex circuit.

FIG. 6 illustrates a flowchart that represents the method of the invention in accordance with an illustrative embodiment for assembling an optical transceiver module that utilizes a folded flex circuit. The method includes providing a folded flex circuit having an upper surface and a lower surface and having at least first, second and third flex circuit portions, wherein one or more optical/electrical devices are mounted on the upper surface on the first flex circuit portion and an electrical connector is mounted on the upper surface on the third flex circuit portion, as indicated by block 601. As described above with reference to FIGS. 2-5, the transceiver module preferably includes stiffener and heat sink devices. As an additional, but optional, step, the transceiver module is secured within a housing such that the optical/electrical devices are contained within the housing, as indicated by block 603.

Figure 7:
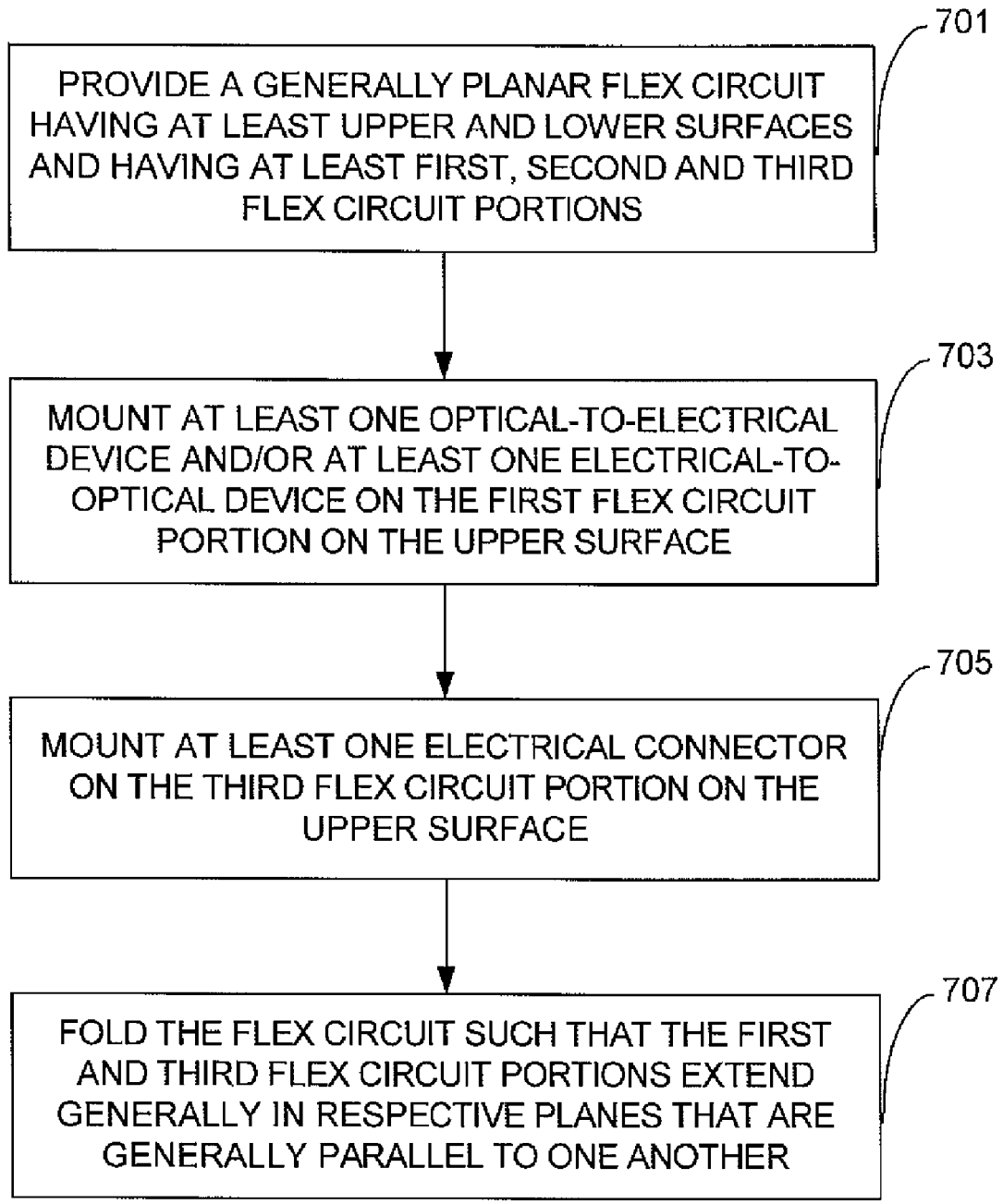
FIG. 7 illustrates a flowchart that represents the method of the invention in accordance with an illustrative embodiment for assembling an optical transceiver module.

FIG. 7 illustrates a flowchart that represents the method of the invention in accordance with an illustrative embodiment for pre-assembling an optical transceiver module. As indicated by block 701, a flex circuit is provided that has at least an upper surface and a lower surface and first, second and third flex circuit portions. One or more optical/electrical devices are mounted on the upper surface on the first portion of the flex circuit, as indicated by block 703. An electrical connector is mounted on the upper surface of the flex circuit on the third flex circuit portion, as indicated by block 705. As indicated above with reference to FIG. 4, subsequent to the pre-assembly process, the flex circuit is folded such that the first and third flex circuit portions extend generally in respective planes that are generally parallel to one another, as indicated by block 707.

It should be noted that the second portion 110F of the flex circuit 110 shown in FIG. 2 and the second and fourth portions 310H and 310J of the flex circuit 310 shown in FIG. 5 provide additional mounting areas on the flex circuits 110 and 310, respectively. Other components or devices may be mounted in these additional areas on the upper and/or lower surfaces 110A, 110B and 310A, 310B of the flex circuits 110 and 310, respectively. Also, additional components or devices not mentioned above may be mounted on the first and third portions 110E and 110G of flex circuit 110 (FIG. 2) and on the first, third and fifth portions 310G, 310I and 310K of the flex circuit 310 (FIG. 5). As will be understood by persons of ordinary skill in the art, other modifications may also be made to the embodiments described herein.

It should be noted that the invention has been described with respect to a few illustrative embodiments for the purpose of describing the principles and concepts of the invention. The invention is not limited to these embodiments. For example, while the invention has been described with reference to using a particular heat spreader device configuration, the invention is not limited to this particular configuration. As will be understood by those skilled in the art in view of the description being provided herein, modifications may be made to the embodiments described herein while still achieving the goals of the invention, and all such modifications are within the scope of the invention.

What is claimed is:

1. A parallel optical transceiver module comprising:
   a folded flex circuit having at least upper and lower surfaces and having at least first, second and third flex circuit portions, the flex circuit having a flexible substrate of dielectrically insulating material and a plurality of electrical conductors disposed in or on the substrate, and wherein the first and third flex circuit portions extend generally in respective planes that are generally parallel to one another such that the upper surface of the flex circuit in the first flex circuit portion is generally parallel to the upper surface of the flex circuit in the third flex circuit portion;
   at least one optical/electrical device mounted on the first flex circuit portion on the upper surface of the flex circuit, said at least one optical/electrical device having one or more electrical contacts that are electrically coupled to one or more of the electrical conductors of the flex circuit;
   at least one electrical connector mounted on the third flex circuit portion on the upper surface of the flex circuit, said at least one electrical connector having one or more electrical contacts that are electrically coupled to one or more of the electrical conductors of the flex circuit such that one or more electrical contacts of said at least one electrical connector are electrically coupled to one or more electrical contacts of said at least one optical/electrical device;
   a stiffener device having at least a first stiffener portion and a second stiffener portion, wherein the lower surface of the folded flex circuit on the first flex circuit portion is secured to the first stiffener portion, and wherein the lower surface of the folded flex circuit on the third flex circuit portion is secured to the second stiffener portion; and
   a heat spreader device having at least first and second heat spreader portions secured to the first and second stiffener portions, respectively, the first and second heat spreader portions being in contact with one another at one or more locations on the first and second heat spreader portions, the first and second heat spreader portions being spaced apart from one another at one or more other locations on the first and second heat spreader portions such that one or more air gaps exist in the heat spreader device that allow air to flow through the heat spreader device to help move heat away from said at least one optical/electrical device.

2. The parallel optical transceiver module of claim 1, further comprising:
   a housing in which the folded flex circuit is secured, wherein the optical/electrical device is contained within the housing.

3. The parallel optical transceiver module of claim 1, wherein said at least one air gap is located between said at least one optical/electrical device and said at least one electrical connector.

4. The parallel optical transceiver module of claim 1, wherein said at least one optical/electrical device includes a laser diode.

5. The parallel optical transceiver module of claim 1, wherein said at least one optical/electrical device includes a plurality of laser diodes.

6. The parallel optical transceiver module of claim 1, wherein said at least one optical/electrical device includes a photodiode.

7. The parallel optical transceiver module of claim 1, wherein said at least one optical/electrical device includes a plurality of photodiodes.

8. The parallel optical transceiver module of claim 1, wherein the electrical connector is one of a ball grid array (BGA), a land grid array (LGA) and a pin grid array (PGA).

9. The parallel optical transceiver module of claim 1, further comprising:
   at least one electrical device mounted on the first flex circuit portion on the upper surface of the flex circuit, said at least one electrical device including an integrated circuit (IC).

10. The parallel optical transceiver module of claim 1, wherein said at least one electrical device comprises a laser diode driver IC.

11. The parallel optical transceiver module of claim 1, wherein said at least one electrical device comprises a controller IC.

12. The parallel optical transceiver module of claim 1, wherein said at least one electrical device comprises a receiver IC.

13. The parallel optical transceiver module of claim 1, wherein the folded flex circuit further includes fourth and fifth flex circuit portions, and wherein the fifth flex circuit portion extends in a plane that is generally co-planar with the plane in which the first flex circuit portion extends such that the upper surface of the flex circuit in the first and fifth flex circuit portions are generally co-planar to one another and generally parallel to the upper surface of the flex circuit in the third flex circuit portion, the parallel optical transceiver module further comprising:

at least one optical/electrical device mounted on the fifth flex circuit portion on the upper surface of the flex circuit.

* * * * *